US011177623B2

(12) United States Patent
Hatori et al.

(10) Patent No.: US 11,177,623 B2
(45) Date of Patent: Nov. 16, 2021

(54) OPTICAL DEVICE AND METHOD OF MANUFACTURING THE SAME

(71) Applicants: FUJITSU LIMITED, Kawasaki (JP); NEC Corporation, Tokyo (JP); Photonics Electronics Technology Research Association, Tokyo (JP)

(72) Inventors: Nobuaki Hatori, Tsukuba (JP); Keizo Kinoshita, Minato (JP)

(73) Assignees: FUJITSU LIMITED, Kawasaki (JP); NEC CORPORATION, Tokyo (JP); PHOTONICS ELECTRONICS TECHNOLOGY RESEARCH ASSOCIATION, Tokyo (JP)

( * ) Notice: Subject to any disclaimer, the term of this patent is extended or adjusted under 35 U.S.C. 154(b) by 0 days.

(21) Appl. No.: 16/659,077

(22) Filed: Oct. 21, 2019

(65) Prior Publication Data
US 2020/0132951 A1    Apr. 30, 2020

(30) Foreign Application Priority Data
Oct. 24, 2018  (JP) .............................. JP2018-200028

(51) Int. Cl.
G02B 6/12    (2006.01)
G02B 6/42    (2006.01)
H01S 5/00    (2006.01)
G02B 6/43    (2006.01)
H01S 5/042   (2006.01)
G02B 1/116   (2015.01)

(52) U.S. Cl.
CPC .......... H01S 5/005 (2013.01); G02B 6/12004 (2013.01); G02B 6/4214 (2013.01); G02B 6/43 (2013.01); H01S 5/0425 (2013.01); G02B 1/116 (2013.01)

(58) Field of Classification Search
CPC .................................................... H01S 5/0425
See application file for complete search history.

(56) References Cited

U.S. PATENT DOCUMENTS

| 2006/0086944 A1* | 4/2006 | Wu ............................ B41J 2/45 257/99 |
| 2011/0206379 A1* | 8/2011 | Budd ................... H04B 10/801 398/116 |
| 2011/0305254 A1* | 12/2011 | Ueki .................... H01S 5/02252 372/45.01 |
| 2012/0153340 A1* | 6/2012 | Song ................... H01L 31/0203 257/99 |
| 2013/0223789 A1* | 8/2013 | Lee ....................... G02B 6/4214 385/14 |

OTHER PUBLICATIONS

Takanori Shimizu et al., "High Density Hybrid Integrated Light Source with a Laser Diode Array on a Silicon Optical Waveguide Platform for Inter-Chip Optical Interconnection", In Digest of the 8th IEEE International Conference on Group IV Photonics, London 2011, Thb5, pp. 181-183.

* cited by examiner

Primary Examiner — Omar R Rojas
(74) Attorney, Agent, or Firm — Staas & Halsey, LLP

(57) ABSTRACT

An optical device includes a light-emitting element; an electronic circuit chip; a substrate on which the light-emitting element and the electronic circuit chip are mounted; a first electrode formed on a first mounting surface of the light-emitting element on the substrate; and a second electrode formed on a second mounting surface of the electronic circuit chip on the substrate. The first electrode and the second electrode have the same structure.

14 Claims, 15 Drawing Sheets

OPTICAL DEVICE AND METHOD OF MANUFACTURING THE SAME

CROSS-REFERENCE TO RELATED APPLICATIONS

This application is based upon and claims the benefit of priority of the prior Japanese Priority Application No. 2018-200028 filed on Oct. 24, 2018, the entire contents of which are hereby incorporated by reference.

FIELD

The present disclosure relates to an optical device and a method of manufacturing the same.

BACKGROUND

In the field of optical devices, development of silicon photonics for forming optical functional devices on silicon substrates has been advancing for reasons including superiority in terms of fabrication technologies, industrial ripple effects, and demand for finer microfabrication; and studies have been conducted for optical integrated devices for arranging optical modulators and optical receivers on silicon substrates. Since silicon has no light-emitting mechanism by itself, external light input is required to produce a signal light. As one of the methods, a hybrid integration scheme has been considered in which a spot-size optical converter is provided on the side of a silicon optical waveguide, a semiconductor laser (Laser Diode: LD) is provided as an external light source, and the LD and the silicon optical waveguide are optically coupled by flip-chip mounting.

RELATED-ART DOCUMENT

[Non-Patent Document 1] T. Shimizu, N. Hatori, M. Okano, M. Ishizaka, T. Yamamoto, Y. Urino, M. Mori, T. Nakamura, Y. Arakawa, "High Density Hybrid Integrated Light Source with a Laser Diode Array on a Silicon Optical Waveguide Platform for Inter-Chip Optical Interconnection", In Digest of the 8th IEEE International Conference on Group IV Photonics, London 2011, ThB5.

When developing an optical device that adopts a hybrid integration scheme, an electronic circuit (IC) chip is required to drive an optical modulator and an optical receiver of an optical integrated device. In such an optical device, the IC chip needs to be mounted in substantially the same way as the LD. As an electrode to which the IC chip is connected, one may consider adopting an electrode that has been used for connecting a conventional IC chip. This electrode has a structure different from that considered to be used for LD connections.

When attempting to implement an optical device with an LD and an IC chip, different electrodes are required to mount the respective devices, which complicates the manufacturing process and increases the number of processing stages. In this case, there is a problem in that the substrate is distorted due to stress difference between the two types of electrodes different from each other, and the reliability as an optical device is impaired.

SUMMARY

In an aspect, an optical device includes a light-emitting element; an electronic circuit chip; a substrate on which the light-emitting element and the electronic circuit chip are mounted; a first electrode formed on a first mounting surface of the light-emitting element on the substrate; and a second electrode formed on a second mounting surface of the electronic circuit chip on the substrate. The first electrode and the second electrode have the same structure.

The object and advantages in the embodiment will be realized and attained by means of the elements and combinations particularly pointed out in the claims. It is to be understood that both the foregoing general description and the following detailed description are exemplary and explanatory and are not restrictive of the invention as claimed.

DESCRIPTION OF EMBODIMENTS

In the following, embodiments of optical devices will be described in detail with reference to the drawings.

First Embodiment

In the present embodiment, a configuration of an optical device will be described along with a method of manufacturing the optical device. FIGS. 1A to 4 are schematic cross-sectional views illustrating a method of manufacturing an optical device in a sequence of processing stages according to the first embodiment.

Figure 1A:
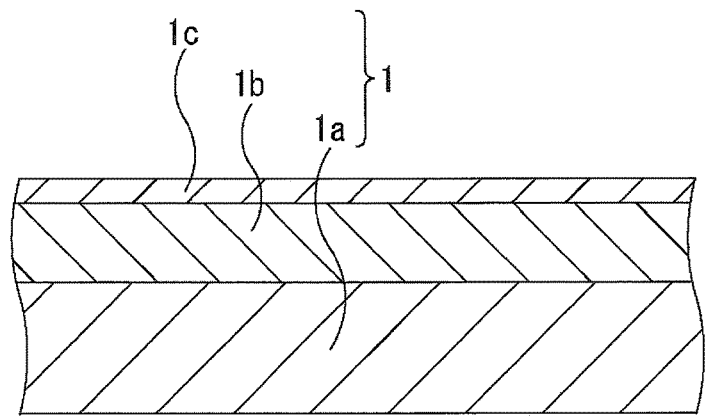
FIGS. 1A to 1C are schematic cross-sectional views illustrating a method of manufacturing an optical device in a sequence of processing stages according to a first embodiment.

First, as illustrated in FIG. 1A, a substrate, here, an SOI substrate 1 is prepared. The SOI substrate 1 is provided with an SOI layer 1c of silicon over a silicon substrate 1a via a BOX layer 1b of SiO$_2$.

Figure 1B:
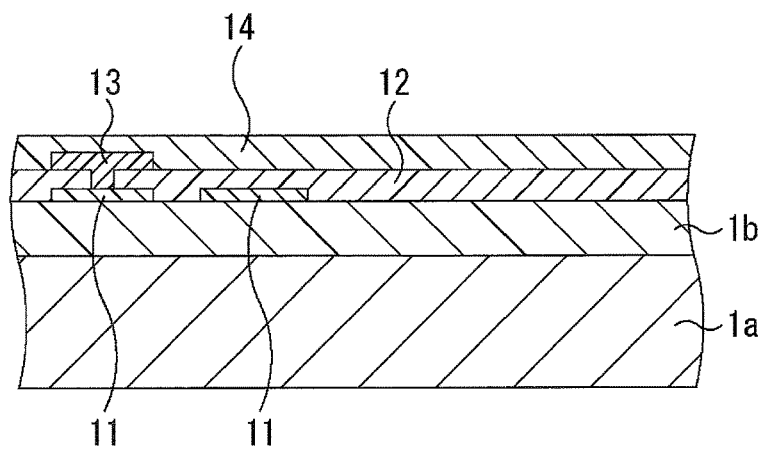

Then, as illustrated in FIG. 1B, optical waveguides 11, a silicon oxide film 12, an Al layer 13, and a silicon nitride film 14 are formed in sequence. Specifically, first, the SOI layer 1c of the SOI substrate 1 is processed by lithography and etching to form the optical waveguides 11. An optical waveguide 11 includes not only the optical waveguide but also functional elements including an optical modulator such as a Mach-Zehnder modulator and an optical receiver such as a photodetector.

Next, the silicon oxide film 12 covering the optical waveguides 11 is formed by a CVD method or the like. The silicon oxide film 12 is processed, aluminum is formed by a sputtering method or the like, and aluminum is processed to form the Al layer 13 having a shape of an electrode. SiN is deposited by a CVD method or the like to cover the Al layer 13 so as to form the silicon nitride film 14.

Figure 1C:
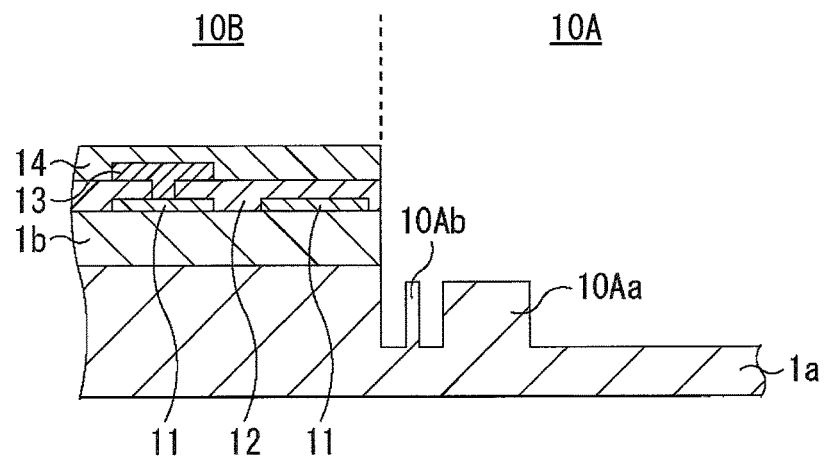

Then, as illustrated in FIG. 1C, a first mounting area 10A and a second mounting area 10B are formed. Specifically, part of the silicon substrate 1a, BOX layer 1b, silicon oxide film 12, and silicon nitride film 14, where a mounting area of a semiconductor laser is to be formed, is processed by lithography and etching. This forms a step in the SOI substrate 1 where the lower side corresponds to the first mounting area 10A (part on the right in the figure) and the upper side corresponds to the second mounting area 10B (part on the left in the figure) adjacent to the first mounting area 10A. In other words, a first mounting surface of the first mounting area 10A is formed to be positioned lower than a second mounting surface of the second mounting area 10B with reference to the bottom surface of the silicon substrate 1a. A semiconductor laser (LD) is mounted on the first mounting surface of the first mounting area 10A, and an electronic circuit (IC) chip is mounted on the second mounting surface of the second mounting area 10B. In the first mounting area 10A, a pedestal 10Aa on which the LD is settled and an alignment portion 10Ab for aligning the LD when being mounted, are formed.

Figure 2A:
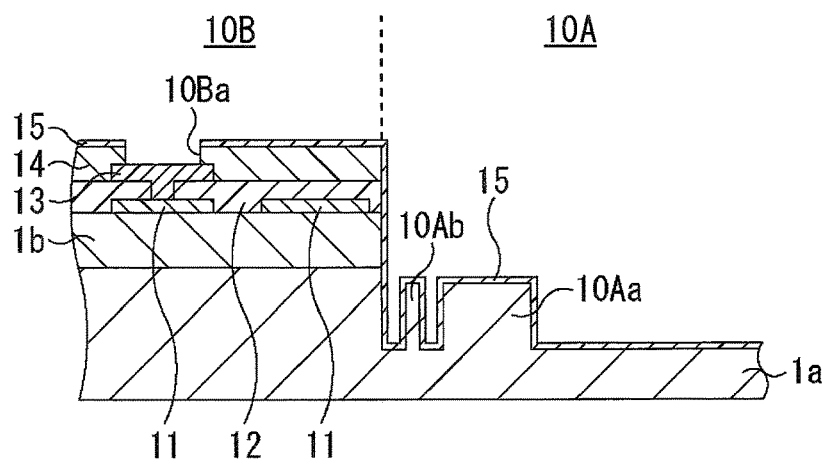
FIGS. 2A to 2C are schematic cross-sectional views illustrating the method of manufacturing the optical device in the sequence of processing stages following FIG. 1C according to the first embodiment.

Next, as illustrated in FIG. 2A, a protective film 15 is formed. Specifically, a silicon oxide film is deposited to have a thickness of approximately 200 nm, for example, by a CVD method, to cover the entire surface. This deposition forms a protective film 15. In the second mounting area 10B, the silicon nitride film 14 and the protective film 15 are processed to form an opening 10Ba that exposes part of the surface of the Al layer 13.

Figure 2B:
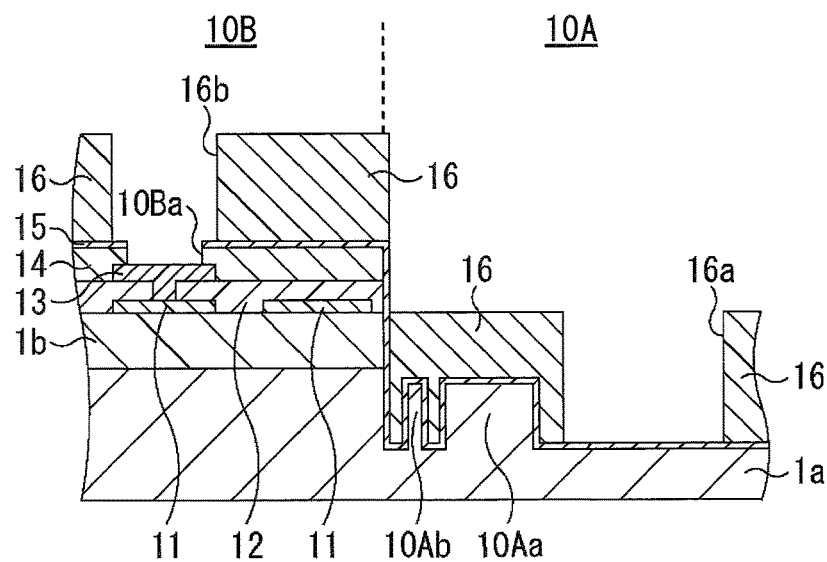

Next, as illustrated in FIG. 2B, a resist mask 16 is formed for forming an electrode. Specifically, resist is coated over the entire surface and the resist is processed by lithography. This forms the resist mask 16 having an opening 16a in the first mounting area 10A and an opening 16b in the second mounting area 10B. In the resist mask 16, the opening 16a exposes a region in the vicinity of the pedestal 10Aa and the opening 16b exposes a region including the opening 10Ba.

Figure 2C:
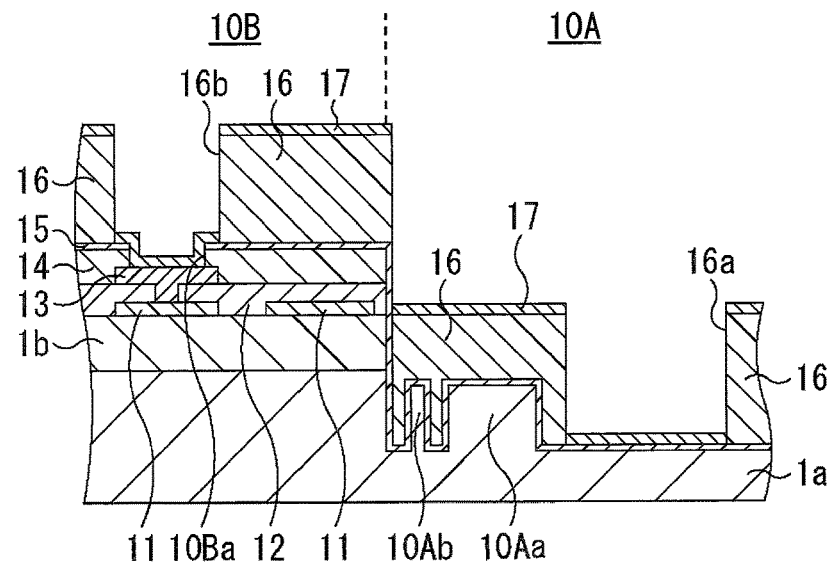

Next, as illustrated in FIG. 2C, electrode materials 17 are deposited over the entire surface. Specifically, predetermined electrode materials 17, which are here constituted with multiple layers of Ti (lower layer)/Pt (intermediate layer)/Au (upper layer) each having a thickness of, for example, approximately 100 nm/approximately 100 nm/approximately 500 nm, are deposited on the entire surface of the resist mask 16 including the openings 16a and 16b by a vapor deposition method.

Figure 3A:
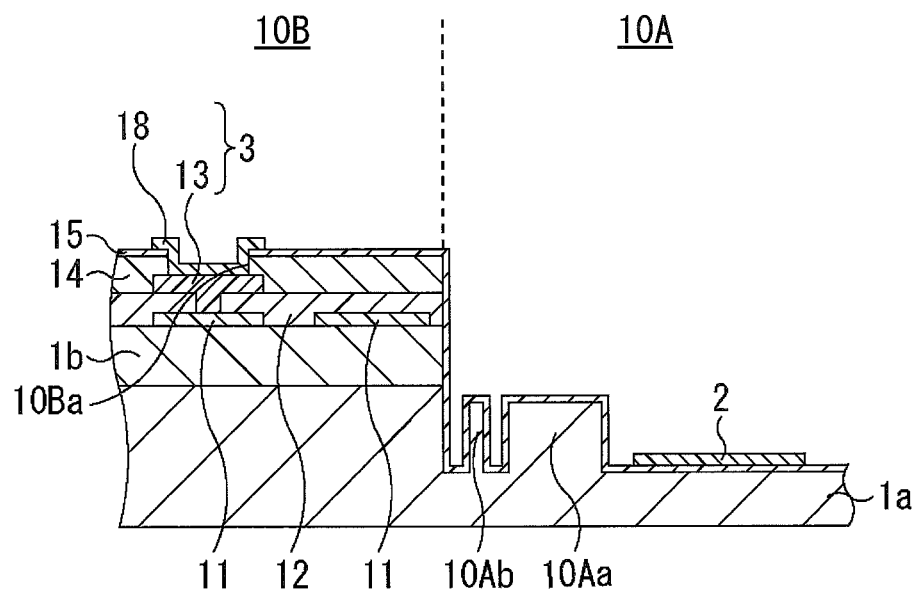
FIGS. 3A to 3B are schematic cross-sectional views illustrating the method of manufacturing the optical device in the sequence of processing stages following FIG. 2C according to the first embodiment.

Next, as illustrated in FIG. 3A, an LD electrode 2 and a UBM (Under Bump Metallurgy) layer 18 having the same structure are formed simultaneously. Specifically, the resist mask 16 and the electrode materials 17 attached thereto are removed by lift-off. Thus, the electrode 2 for the semiconductor laser (LD) and the UBM layer 18 having the same structure (the same materials, the same layer structure, and the same thickness) are formed simultaneously. In other words, the LD electrode 2 and the UBM layer 18 are formed as structures in which multiple conductive films of the same materials having substantially the same thickness are layered. The LD electrode 2 is formed on the first mounting surface of the first mounting area 10A, and the UBM layer 18 is formed on the second mounting surface of the second mounting area 10B. In the second mounting area 10B, the Al layer 13 and the UBM layer 18 connected to the Al layer 13 via the opening 10Ba constitute an IC electrode 3. As the electrode materials 17 of the LD electrode 2 and the UBM layer 18, it is favorable to use Au having excellent connection reliability for the topmost layer; in the present embodiment, Ti is used for the lower layer as an adhesive layer, Pt is used for the intermediate layer as a barrier layer, and Au is used for the topmost layer.

Conventionally, when an IC chip is mounted on a substrate, Ni (lower layer)/Au (upper layer) have been used as the materials of the UBM layer. Meanwhile, Ti (lower layer)/Pt (intermediate layer)/Au (upper layer) are considered favorable as the materials of the electrode for an LD. In the case of mounting an LD and an IC chip on the same substrate as in the present embodiment, if different materials as described above were used for the LD electrode and the UBM layer, the manufacturing process would become complicated and the number of processing stages would be increased. Also, forming the LD electrode and the UBM layer of different materials might generate distortion in an optical device caused by stress difference due to the difference in the electrode materials, and hence, might impair the reliability. In particular, in the case of forming a step on the substrate as in the present embodiment, distortion caused by stress difference would become considerable, and it would become difficult to secure the reliability.

In the present embodiment, when mounting the LD and IC chip on the same substrate, the LD electrode 2 and the UBM layer 18 are simultaneously formed to have the same structure. This enables to simplify the manufacturing process, to reduce the number of processing stages, to generate no stress difference thanks to no difference in the electrode materials, and to obtain high reliability even if forming a step on the substrate.

Figure 3B:
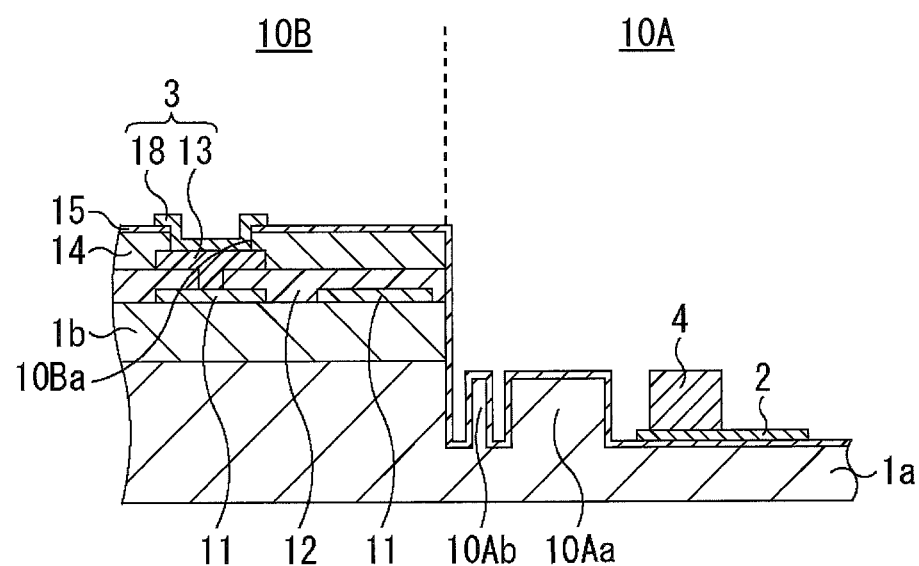

Next, as illustrated in FIG. 3B, a first solder layer 4 is formed on the LD electrode 2. Specifically, a resist mask is formed to open a part of the surface of the LD electrode 2, and a predetermined solder material, here AuSn, is deposited on the entire surface of the resist mask including the inside of the opening. The resist mask and the solder material attached thereto are removed by lift-off. Thus, the first solder layer 4 of AuSn is formed on the LD electrode 2. The surface of the first solder layer 4 is coplanar with the surface of the protective film 15 on the pedestal 10Aa and with the surface of the protective film 15 on the alignment portion 10Ab.

Figure 5:
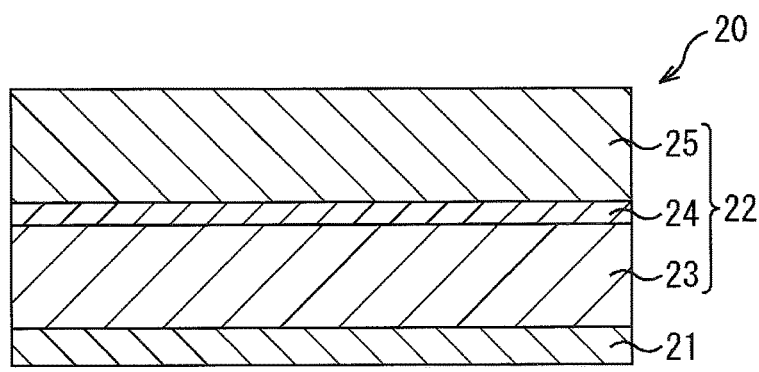
FIG. 5 is a schematic cross-sectional view illustrating a configuration of an LD mounted on an optical device according to the first embodiment.

FIG. 5 is a schematic cross-sectional view illustrating a configuration of an LD mounted on the optical device according to the present embodiment. This LD 20 is a light source, in which an optical waveguide 22 is provided on a substrate 21 of GaAs or the like, a reflective or non-reflective film (not illustrated) is provided on both end surfaces of the optical waveguide 22 when necessary, and a pair of electrodes (not illustrated) are provided at the top and bottom. The optical waveguide 22 is a so-called ridge-type optical waveguide in which an active layer 24 of, for example, InGaAs, InAs, or the like is sandwiched between a lower cladding layer 23 of, for example, AlGaAs and an upper cladding layer 25 of, for example, GaInP, where the latter is positioned above in FIG. 5. In the upper cladding layer 25, a diffraction grating (not illustrated) may be provided above the active layer 24 to emit light having a single wavelength.

Figure 6:
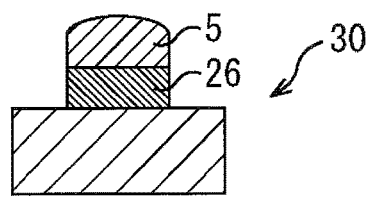
FIG. 6 is a schematic cross-sectional view illustrating a configuration of an IC chip mounted on an optical device according to the first embodiment.

FIG. 6 is a schematic cross-sectional view illustrating a configuration of an IC chip mounted on the optical device according to the present embodiment. This IC chip 30 includes an IC for driving an optical modulator or an optical receiver, which constitutes a specific element of the optical waveguide 11. On the surface of the IC chip 30, an electrode 26 made of, for example, Ni (lower layer)/Au (upper layer) is formed for external connection, and on the surface of the electrode 26, for example, a second solder layer 5 of, for example, SnAg is provided.

Figure 4:
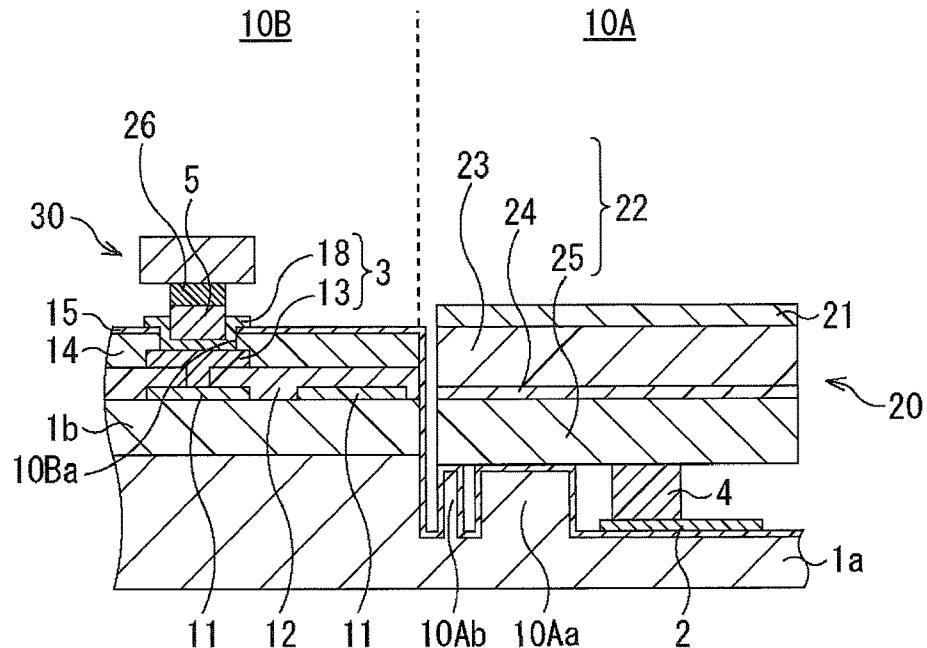
FIG. 4 is a schematic cross-sectional view illustrating the method of manufacturing the optical device in the sequence of processing stages following FIG. 3B according to the first embodiment.

Following from FIG. 3B, as illustrated in FIG. 4, the LD 20 is mounted on the first mounting area 10A and the IC chip 30 is mounted on the second mounting area 10B. Specifically, the LD 20 is mounted over the pedestal 10Aa via the protective film 15 of the first mounting area 10A such that one end of the active layer 24 of the LD 20 is positionally aligned to face one end of the optical waveguide 11 with reference to the alignment portion 10Ab. The LD 20 is settled over the pedestal 10Aa via the protective film 15 to establish a connection by the first solder layer 4; one end of the active layer 24 is positionally aligned with one end of the optical waveguide 11; thus, the active layer 24 and the optical waveguide 11 are optically coupled. The SOI substrate 1 has the step formed such that the first mounting area 10A is positioned lower relative to the second mounting area 10B. Therefore, the LD 20 can be easily mounted to be in a state where one end of the active layer 24 of the LD 20 is positionally aligned with one end of the optical waveguide 11 precisely. The LD 20 is securely mounted on the first mounting area 10A by the first solder layer 4 that is suitable for establishing a connection with the LD electrode 2.

The IC chip 30 is mounted to be connected on the UBM layer 18 of the second mounting area 10B by having the second solder layer 5 of the IC chip 30 come face to face with the UBM layer 18. The IC chip 30 is securely mounted on the second mounting area 10B by the second solder layer 5 that is suitable for establishing a connection with the UBM layer 18. Thus, the optical device according to the present embodiment is formed.

As described above, according to the present embodiment, an optical device is realized that has an LD 20 and an IC chip 30 mounted on the same substrate, has high reliability, and enables to simplify the manufacturing process and to achieve a reduction in the number of processing stages.

Modified Example

In the following, a modified example of the first embodiment will be described. In the present example, as in the first embodiment, a configuration of an optical device will be described along with a method of manufacturing the optical device, in which a different method is adopted for forming electrodes to which an LD and an IC chip are connected, and in this regard, differs from the first embodiment. FIGS. 7A to 9B are schematic cross-sectional views illustrating major processing stages of the optical device according to the modified example of the first embodiment. Components corresponding to the first embodiment have the same reference codes assigned.

Figure 7A:
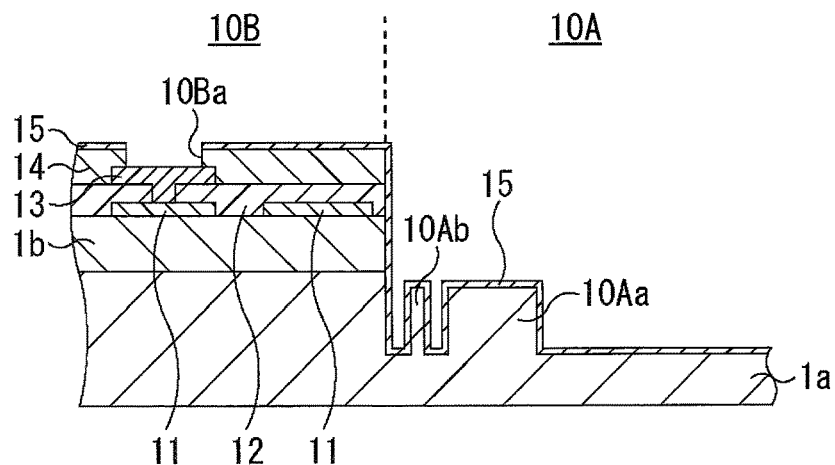
FIGS. 7A to 7C are schematic cross-sectional views illustrating major processing stages of an optical device according to a modified example of the first embodiment.

First, as in the first embodiment, processing stages are carried out as in FIGS. 1A to 2A. FIG. 7A illustrates a state where a protective film 15 and an opening 10Ba have been formed.

Figure 7B:
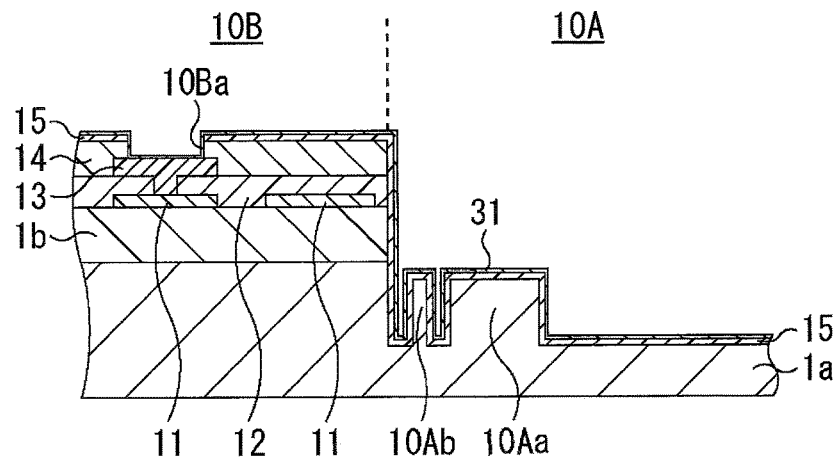

Next, as illustrated in FIG. 7B, a plating seed layer 31 is formed. Specifically, Ti (lower layer)/Cu (upper layer) are deposited, for example, by a vapor deposition method, to cover the entire surface including the opening 10Ba. Ti forms an adhesive film and Cu forms a seed film. Thus, the plating seed layer 31 is formed.

Figure 7C:
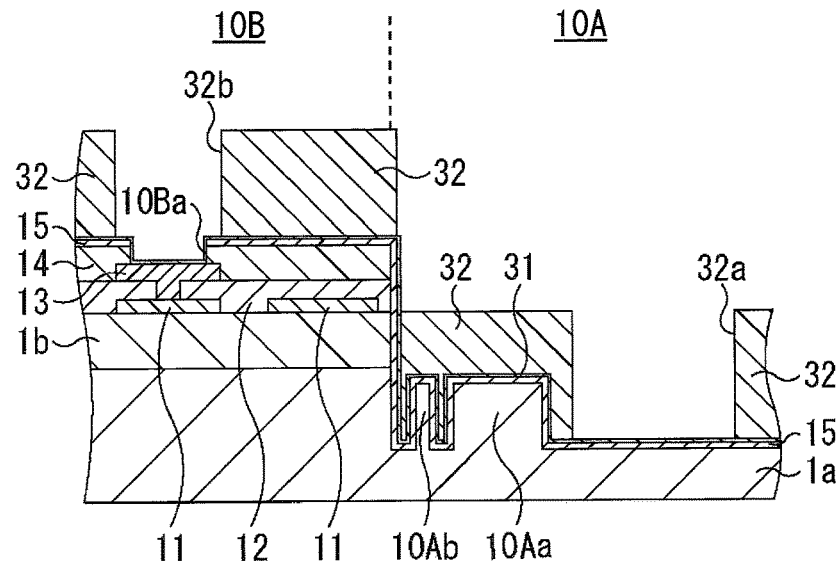

Next, as illustrated in FIG. 7C, a resist mask 32 is formed for forming an electrode. Specifically, resist is coated over the entire surface and the resist is processed by lithography. This forms the resist mask 32 having an opening 32a in the first mounting area 10A and an opening 32b in the second mounting area 10B. In the resist mask 32, the opening 32a exposes a region in the vicinity of the pedestal 10Aa and the opening 32b exposes a region including the opening 10Ba.

Figure 8A:
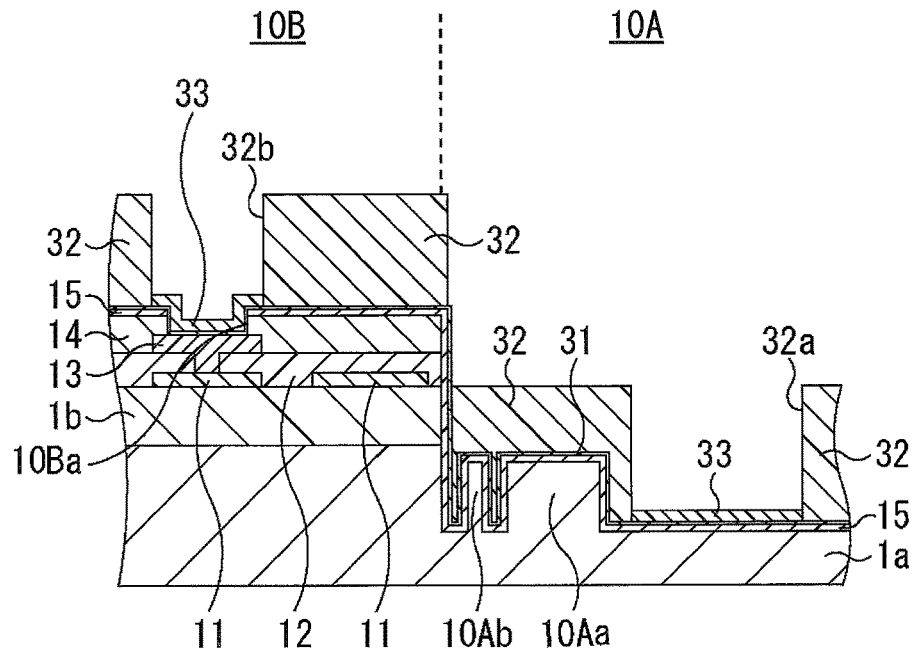
FIGS. 8A to 8B are schematic cross-sectional views illustrating major processing stages of the optical device following FIG. 7C according to the modified example of the first embodiment.

Next, as illustrated in FIG. 8A, electrode materials 33 are deposited. Specifically, predetermined electrode materials 33 are deposited on the plating seed layer 31 exposed in the openings 32a and 32b by an electric field plating method to form a multi-layer configuration of Ni (lower layer)/Au (upper layer) each of which has a thickness of, for example, approximately 1 nm/approximately 150 nm.

Figure 8B:
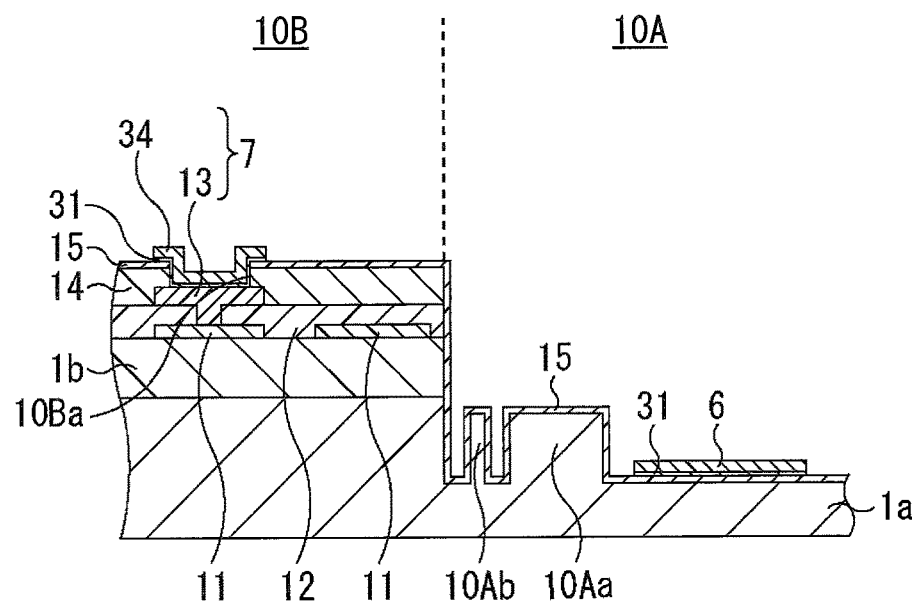

Next, as illustrated in FIG. 8B, an LD electrode 6 and a UBM layer 34 having the same structure are formed simultaneously. Specifically, a resist mask 32 and the plating seed layer 31 below are removed. Thus, the LD electrode 6 and the UBM layer 34 having the same structure (the same materials, the same layer structure, and the same thickness) are formed simultaneously. In other words, the LD electrode 6 and the UBM layer 34 are formed as structures in which multiple conductive films of the same materials having substantially the same thickness are layered. The LD electrode 6 is formed on the first mounting surface of the first mounting area 10A, and the UBM layer 34 is formed on the second mounting surface of the second mounting area 10B. In the second mounting area 10B, the Al layer 13 and the UBM layer 34 connected to the Al layer 13 via the opening 10Ba constitute an IC electrode 7. As the electrode materials 33 of the LD electrode 6 and the UBM layer 34, it is favorable to use Au having excellent connection reliability for the topmost layer; in the present example, Ni is used for the lower layer as an adhesive layer and Au is used for the topmost layer.

Conventionally, when an IC chip is mounted on a substrate, Ni (lower layer)/Au (upper layer) have been used as the materials of the UBM layer. Meanwhile, Ti (lower layer)/Pt (intermediate layer)/Au (upper layer) may be considered as the materials of an LD electrode. In the case of mounting an LD and an IC chip on the same substrate as in the present example, if different materials as described above were used for the LD electrode and the UBM layer, the manufacturing process would become complicated and the number of processing stages would be increased. Also, forming the LD electrode and the UBM layer of different materials might generate distortion in an optical device caused by stress difference due to the difference in the electrode materials, and hence, might impair the reliability. In particular, in the case of forming a step on the substrate as in the present example, distortion caused by stress difference would become considerable, and it would become difficult to secure the reliability.

In the present example, when mounting the LD and IC chip on the same substrate, the LD electrode 6 and the UBM layer 34 are simultaneously formed to have the same structure. This enables to simplify the manufacturing process, to reduce the number of processing stages, to generate no stress difference thanks to no difference in the electrode materials, and to obtain high reliability even if forming a step on the substrate.

Figure 9A:
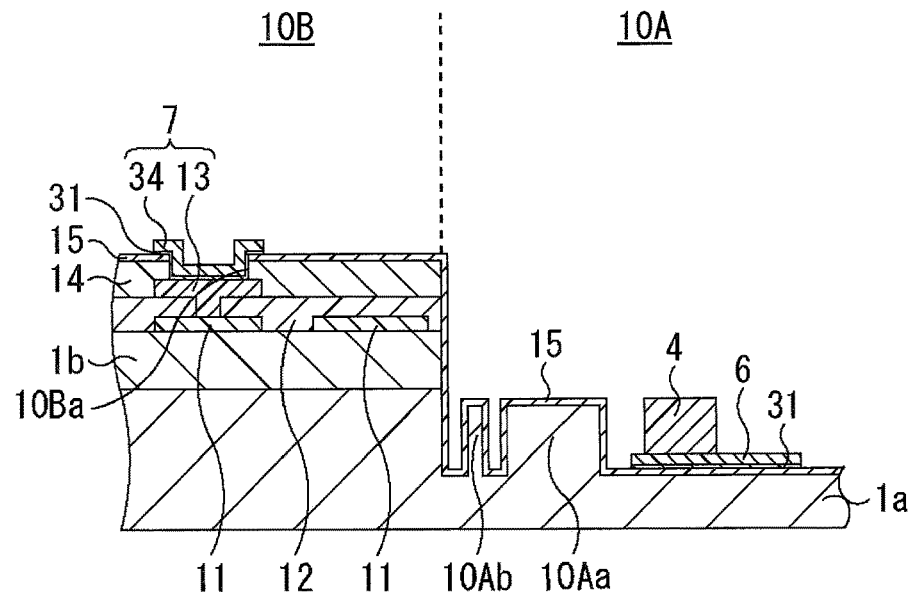
FIGS. 9A to 9B are schematic cross-sectional views illustrating major processing stages of the optical device following FIG. 8B according to the modified example of the first embodiment.

Next, as illustrated in FIG. 9A, a first solder layer 4 is formed on the LD electrode 6. Specifically, a resist mask is formed to open a part of the surface of the LD electrode 6, and a predetermined solder material, here AuSn, is deposited on the entire surface of the resist mask including the inside of the opening. The resist mask and the solder material attached thereto are removed by lift-off. Thus, the first solder layer 4 of AuSn is formed on the LD electrode 6. The surface of the first solder layer 4 is coplanar with the surface of the protective film 15 on the pedestal 10Aa and with the surface of the protective film 15 on the alignment portion 10Ab.

Figure 9B:
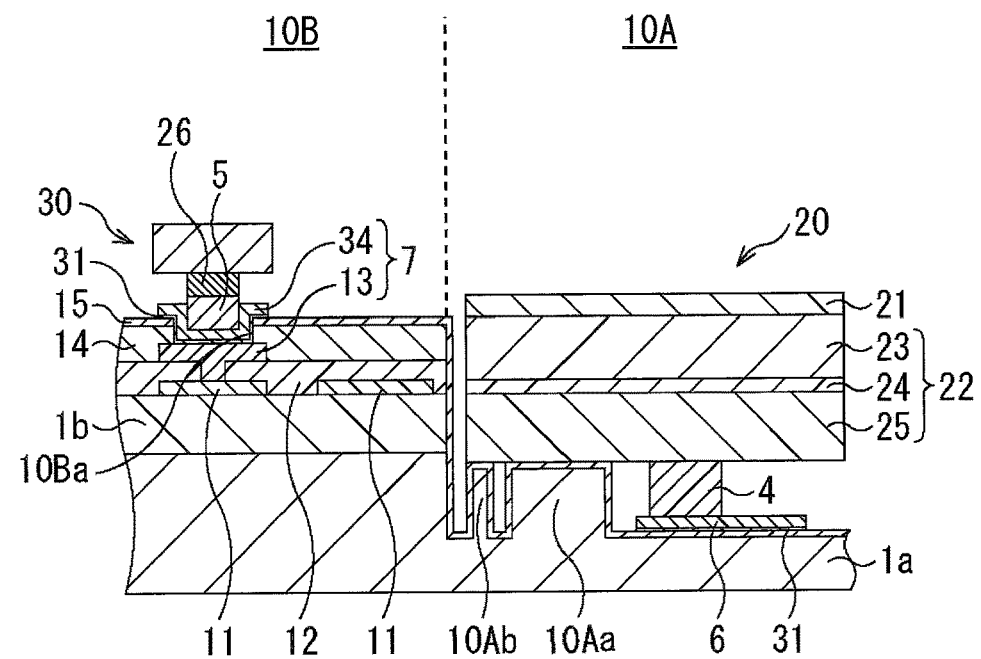

Next, as illustrated in FIG. 9B, the LD 20 is mounted on the first mounting area 10A and the IC chip 30 is mounted on the second mounting area 10B. Specifically, the LD 20 is mounted over the pedestal 10Aa via the protective film 15 of the first mounting area 10A such that one end of the active layer 24 of the LD 20 is positionally aligned to face one end of the optical waveguide 11 with reference to the alignment portion 10Ab. The LD 20 is settled over the pedestal 10Aa via the protective film 15 to establish a connection by the first solder layer 4; one end of the active layer 24 is positionally aligned with one end of the optical waveguide 11; thus, the active layer 24 and the optical waveguide 11 are optically coupled. The SOI substrate 1 has the step formed such that the first mounting area 10A is positioned lower relative to the second mounting area 10B. Therefore, the LD 20 can be easily mounted to be in a state where one end of the active layer 24 of the LD 20 is positionally aligned with one end of the optical waveguide 11 precisely. The LD 20 is securely mounted on the first mounting area 10A by the first solder layer 4 that is suitable for establishing a connection with the LD electrode 6.

The IC chip 30 is mounted to be connected on the UBM layer 34 of the second mounting area 10B by having the second solder layer 5 of the IC chip 30 come face to face with the UBM layer 34. The IC chip 30 is securely mounted on the second mounting area 10B by the second solder layer 5 that is suitable for establishing a connection with the UBM layer 34. Thus, the optical device according to the present example is formed.

As described above, according to the present example, an optical device is realized that has an LD 20 and an IC chip 30 mounted on the same substrate, has high reliability, and enables to simplify the manufacturing process and to achieve a reduction in the number of processing stages.

Second Embodiment

In the present embodiment, as in the first embodiment, a configuration of an optical device will be described along with a method of manufacturing the optical device, in which a first mounting area and a second mounting area are formed as flat surfaces, and in this regard, differs from the first embodiment. FIGS. 10A to 13 are schematic cross-sectional views illustrating a method of manufacturing an optical device in a sequence of processing stages according to the second embodiment. Components corresponding to the first embodiment have the same reference codes assigned.

Figure 10A:
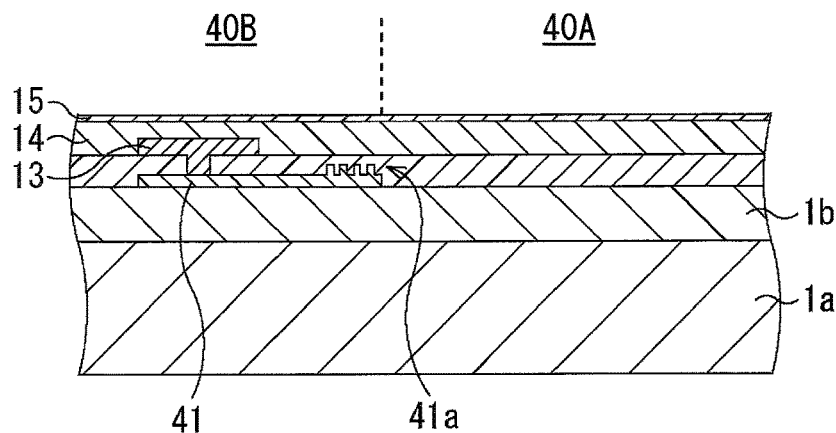
FIGS. 10A to 10C are schematic cross-sectional views illustrating a method of manufacturing an optical device in a sequence of processing stages according to a second embodiment.

First, as illustrated in FIG. 10A, an optical waveguide 41, a silicon oxide film 12, an Al layer 13, and a silicon nitride film 14 are formed in sequence. Specifically, first, an SOI layer 1c of an SOI substrate 1 is processed by lithography and etching to form the optical waveguide 41. At the tip of the optical waveguide 41, a grating coupler 41a is formed for optical coupling. The optical waveguide 41 includes not only the optical waveguide but also functional elements including an optical modulator such as a Mach-Zehnder modulator and an optical receiver such as a photodetector.

Next, the silicon oxide film 12 covering the optical waveguides 41 is formed by a CVD method or the like. The silicon oxide film 12 is processed, aluminum is formed by a sputtering method or the like, and aluminum is processed to form the Al layer 13 having a shape of an electrode. SiN is deposited by a CVD method or the like to cover the Al layer 13 so as to form the silicon nitride film 14.

In the present embodiment, a region not including the optical waveguide 41 and the Al layer 13 (part on the right in the figure) corresponds to a first mounting area 40A, and a region including the optical waveguide 41 and the Al layer 13 (part on the left in the figure) corresponds to a second mounting area 40B. Unlike the first embodiment, a step is not formed on the SOI substrate 1, and the first mounting area 40A is coplanar with the second mounting area 40B.

Figure 10B:
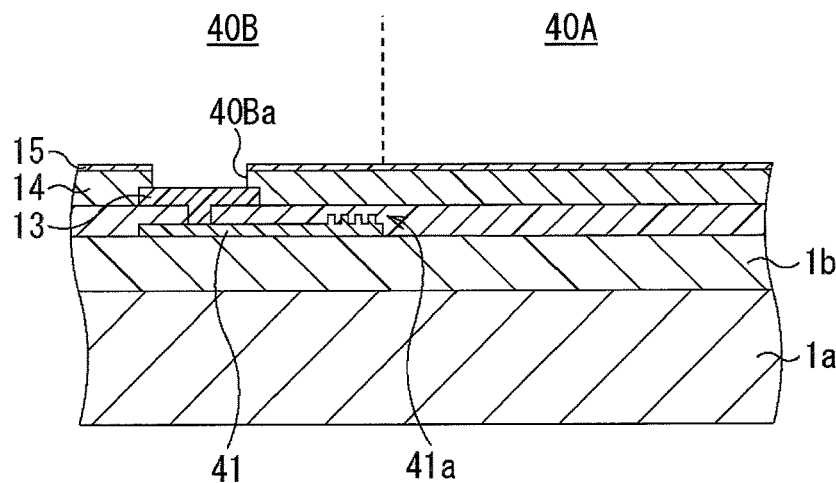

Next, as illustrated in FIG. 10B, a protective film 15 is formed. Specifically, a silicon oxide film is deposited to have a thickness of approximately 200 nm, for example, by a CVD method, to cover the entire surface. This deposition forms a protective film 15. In the second mounting area 40B, the silicon nitride film 14 and the protective film 15 are processed to form an opening 40Ba that exposes part of the surface of the Al layer 13.

Figure 10C:
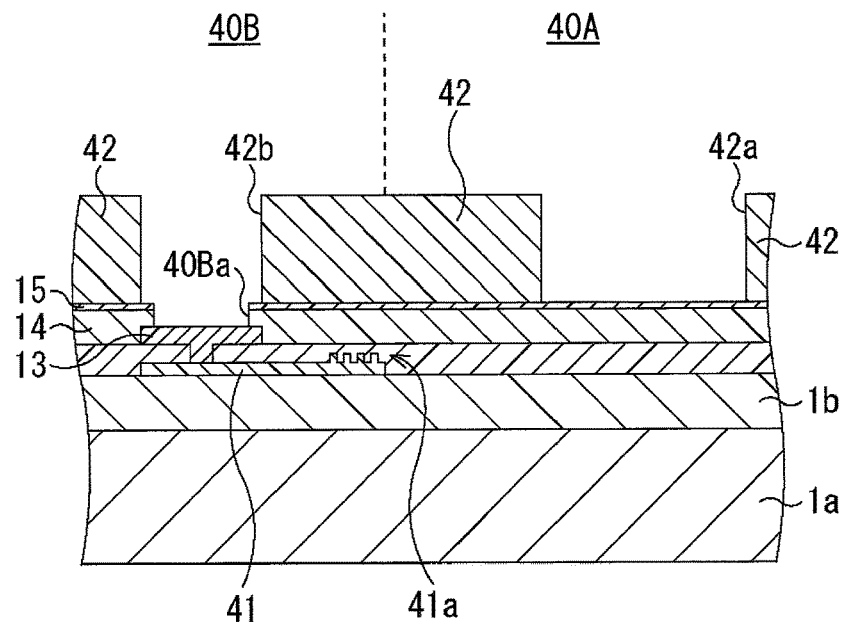

Next, as illustrated in FIG. 10C, a resist mask 42 is formed for forming an electrode. Specifically, resist is coated over the entire surface and the resist is processed by lithography.

This forms the resist mask 42 having an opening 42a in the first mounting area 40A and an opening 42b in the second mounting area 40B. In the resist mask 42, the opening 42a exposes a predetermined region and the opening 42b exposes a region including the opening 40Ba.

Figure 11A:
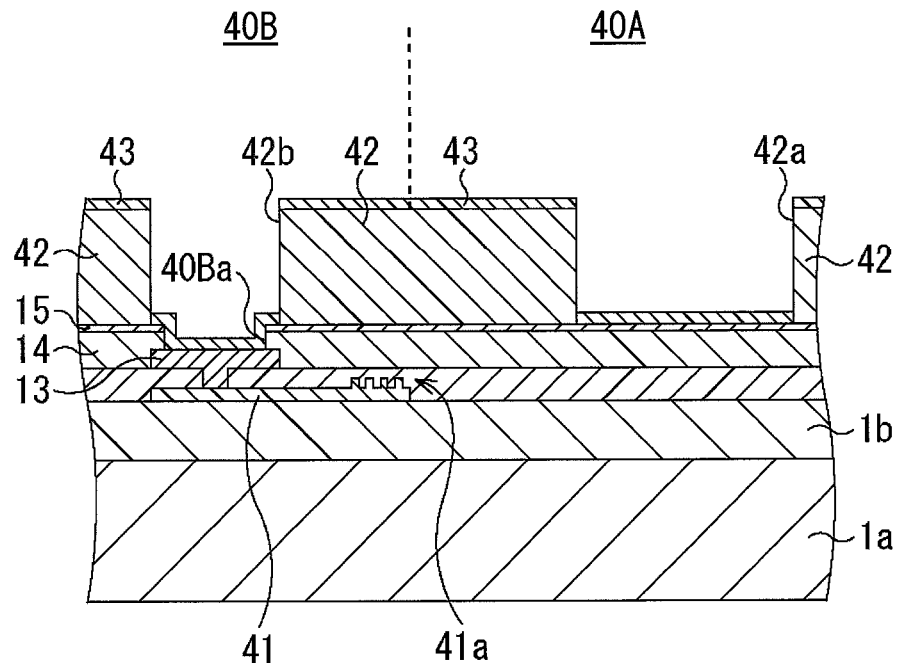
FIGS. 11A to 11B are schematic cross-sectional views illustrating the method of manufacturing the optical device in the sequence of processing stages following FIG. 10C according to the second embodiment.

Next, as illustrated in FIG. 11A, electrode materials 43 are deposited over the entire surface. Specifically, predetermined electrode materials 43, which are here constituted with multiple layers of Ti (lower layer)/Pt (intermediate layer)/Au (upper layer) each having a thickness of, for example, approximately 100 nm/approximately 100 nm/approximately 500 nm, are deposited on the entire surface of the resist mask 42 including the openings 42a and 42b by a vapor deposition method.

Figure 11B:
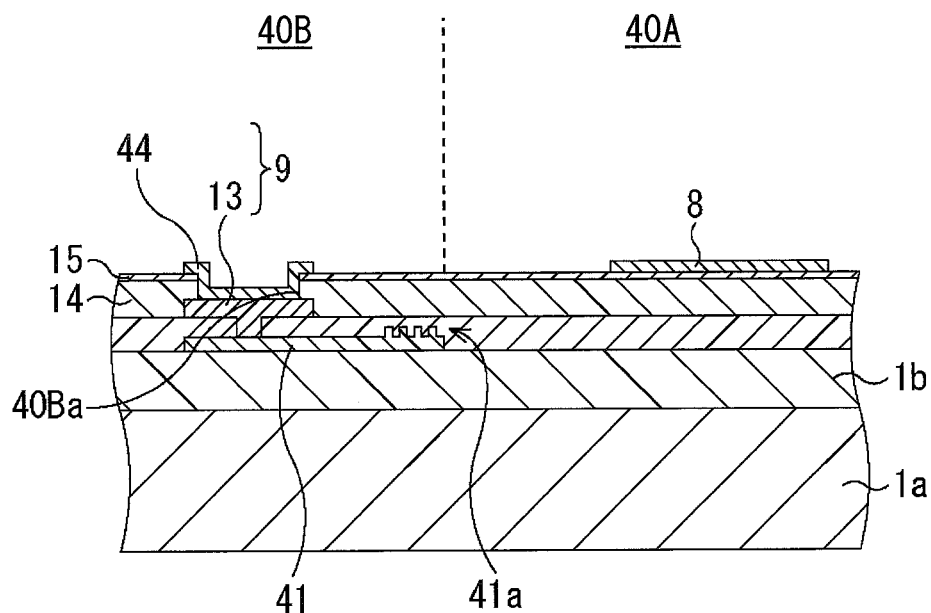

Next, as illustrated in FIG. 11B, an LD electrode 8 and a UBM layer 44 having the same structure are formed simultaneously. Specifically, the resist mask 42 and the electrode materials 43 attached thereto are removed by lift-off. Thus, the LD electrode 8 and the UBM layer 44 having the same structure (the same materials, the same layer structure, and the same thickness) are formed simultaneously. In other words, the LD electrode 8 and the UBM layer 44 are formed as structures in which multiple conductive films of the same materials having substantially the same thickness are layered. The LD electrode 8 is formed on the first mounting surface of the first mounting area 40A, and the UBM layer 44 is formed on the second mounting surface of the second mounting area 40B. In the second mounting area 40B, the Al layer 13 and the UBM layer 44 connected to the Al layer 13 via the opening 40Ba constitute an IC electrode 9. As the electrode materials 43 of the LD electrode 8 and the UBM layer 44, it is favorable to use Au having excellent connection reliability for the topmost layer; in the present embodiment, Ti is used for the lower layer as an adhesive layer, Pt is used for the intermediate layer as a barrier layer, and Au is used for the topmost layer.

Conventionally, when an IC chip is mounted on a substrate, Ni (lower layer)/Au (upper layer) have been used as the materials of the UBM layer. Meanwhile, Ti (lower layer)/Pt (intermediate layer)/Au (upper layer) are considered favorable as the materials of the electrode for an LD. In the case of mounting an LD and an IC chip on the same substrate as in the present embodiment, if different materials as described above were used for the LD electrode and the UBM layer, the manufacturing process would become complicated and the number of processing stages would be increased. Also, forming the LD electrode and the UBM layer of different materials might generate distortion in an optical device caused by stress difference due to the difference in the electrode materials, and hence, might impair the reliability.

In the present embodiment, when mounting the LD and IC chip on the same substrate, the LD electrode 8 and the UBM layer 44 are simultaneously formed to have the same structure. This enables to simplify the manufacturing process, to reduce the number of processing stages, to generate no stress difference thanks to no difference in the electrode materials, and to obtain high reliability. In particular, in the present embodiment, a step is not formed on the SOI substrate 1, and the first mounting area 40A is coplanar with the second mounting area 40B; therefore, distortion in the optical device is further alleviated, and higher reliability is realized.

Figure 12A:
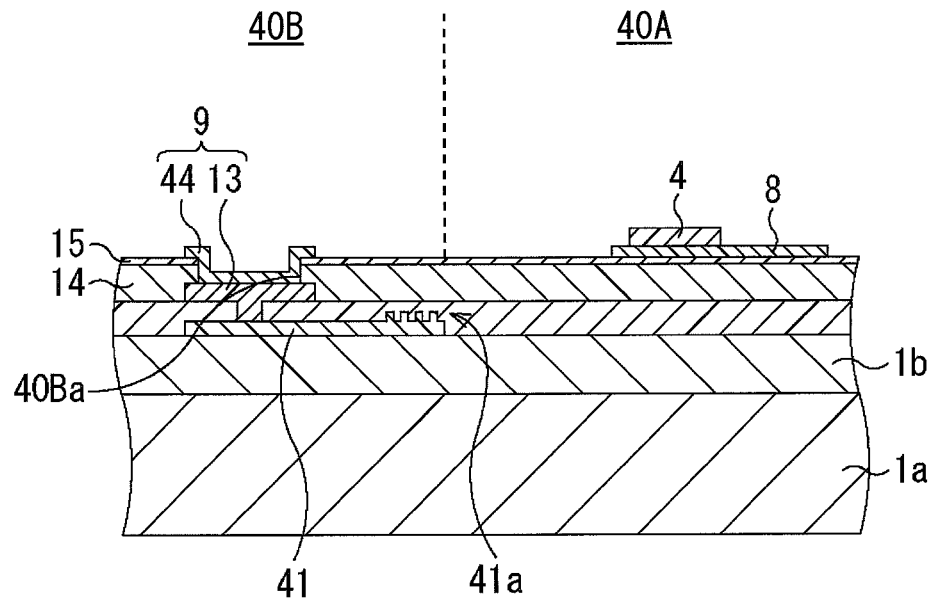
FIGS. 12A to 12B are schematic cross-sectional views illustrating the method of manufacturing the optical device in the sequence of processing stages following FIG. 11B according to the second embodiment.

Next, as illustrated in FIG. 12A, a first solder layer 4 is formed on the LD electrode 8. Specifically, a resist mask is formed to open a part of the surface of the LD electrode 8, and a predetermined solder material, here AuSn, is deposited on the entire surface of the resist mask including the inside of the opening. The resist mask and the solder material attached thereto are removed by lift-off. Thus, the first solder layer 4 of AuSn is formed on the LD electrode 8.

Figure 12B:
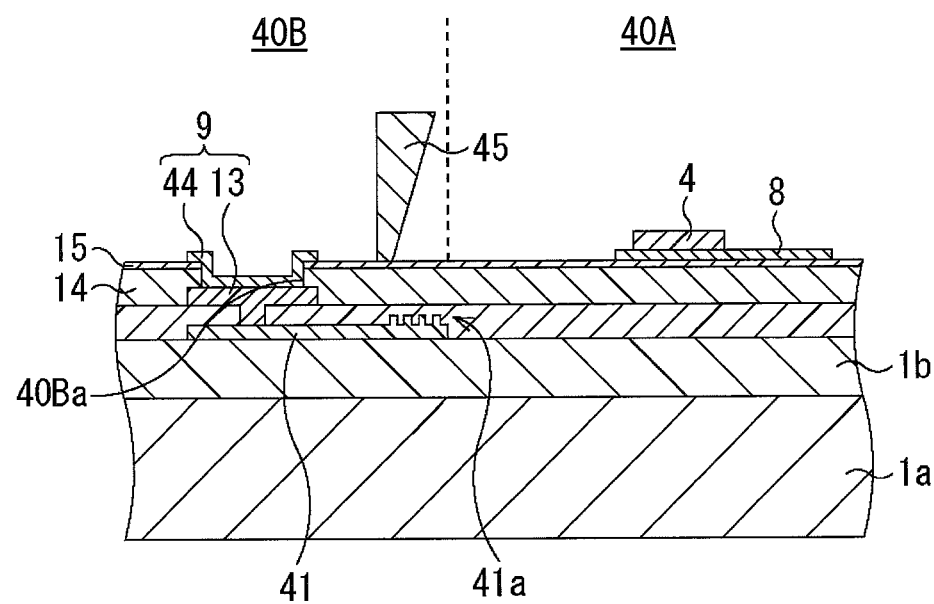

Next, as illustrated in FIG. 12B, a reflective mirror (mirror) 45 is provided. Specifically, a mirror 45 made of, for example, silicon, is provided on the protective film 15 in the second mounting area 40B near the interface with the first mounting area 40A such that the reflective surface faces an end surface on the light-emitting side of the LD 20, which is to be mounted later.

Figure 13:
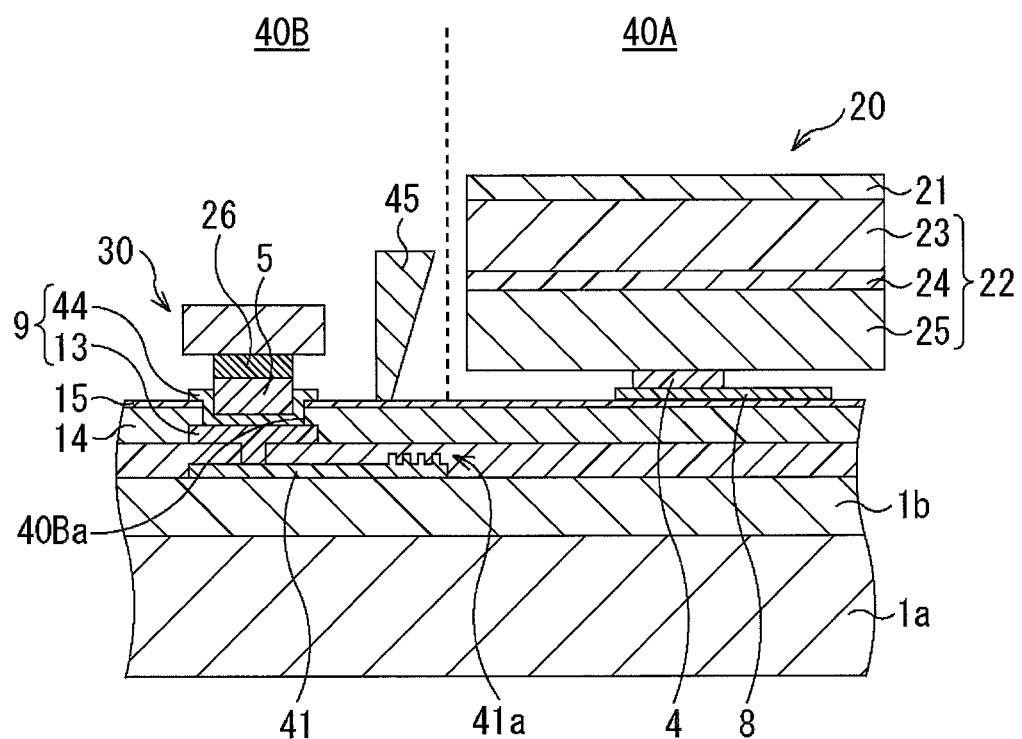
FIG. 13 is a schematic cross-sectional view illustrating the method of manufacturing the optical device in the sequence of processing stages following FIG. 12B according to the second embodiment.

Next, as illustrated in FIG. 13, the LD 20 is mounted on the first mounting area 40A and the IC chip 30 is mounted on the second mounting area 40B. Specifically, the LD 20 is mounted to be connected on the first solder layer 4 of the first mounting area 40A. The LD 20 is arranged such that its end surface on the light-emitting side faces the reflective surface of the mirror 45, and one end of the active layer 24 is optically coupled with (the grating coupler 41a at) one end of the optical waveguide 41 via the mirror 45. Providing the mirror 45 enables to easily and securely obtain optical coupling between the LD 20 and the optical waveguide 41 even in the case where the first mounting area 40A is coplanar with the second mounting area 40B. The LD 20 is securely mounted on the first mounting area 40A by the first solder layer 4 that is suitable for establishing a connection with the LD electrode 8.

The IC chip 30 is mounted to be connected on the UBM layer 44 of the second mounting area 40B by having the second solder layer 5 of the IC chip 30 come face to face with the UBM layer 44. The IC chip 30 is securely mounted on the second mounting area 40B by the second solder layer 5 that is suitable for establishing a connection with the UBM layer 44. Thus, the optical device according to the present embodiment is formed.

As described above, according to the present embodiment, an optical device is realized that has an LD 20 and an IC chip 30 mounted on the same substrate, has high reliability, and enables to simplify the manufacturing process and to achieve a reduction in the number of processing stages.

First Modified Example

In the following, a first modified example of the second embodiment will be described. In the present example, as in the second embodiment, a configuration of an optical device will be described along with a method of manufacturing the optical device, in which a different method is adopted for forming electrodes to which an LD and an IC chip are connected, and in this regard, differs from the second embodiment. FIGS. 14A to 17 are schematic cross-sectional views illustrating major processing stages in the manufacturing process of an optical device according to the first modified example of the second embodiment. Components corresponding to the second embodiment have the same reference codes assigned.

Figure 14A:
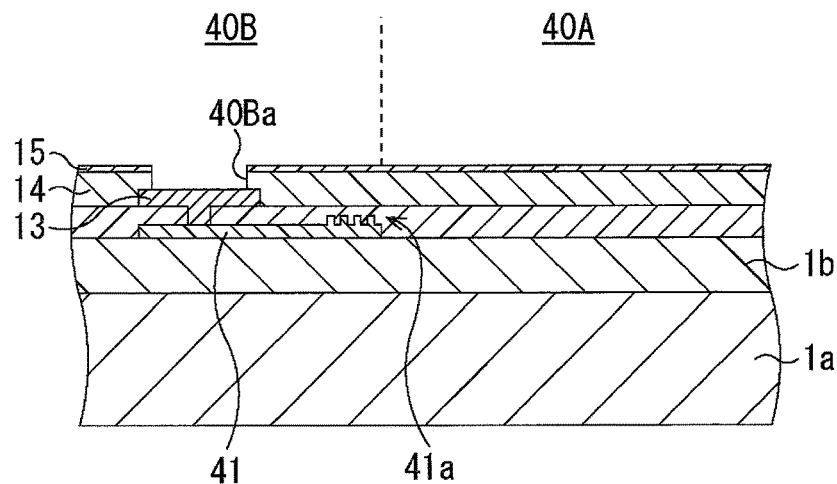
FIGS. 14A to 14C are schematic cross-sectional views illustrating major processing stages of an optical device according to a first modified example of the second embodiment.

First, as in the second embodiment, the processing stages are carried out as in FIGS. 10A to 10B. FIG. 14A illustrates a state where a protective film 15 and an opening 40Ba have been formed.

Figure 14B:
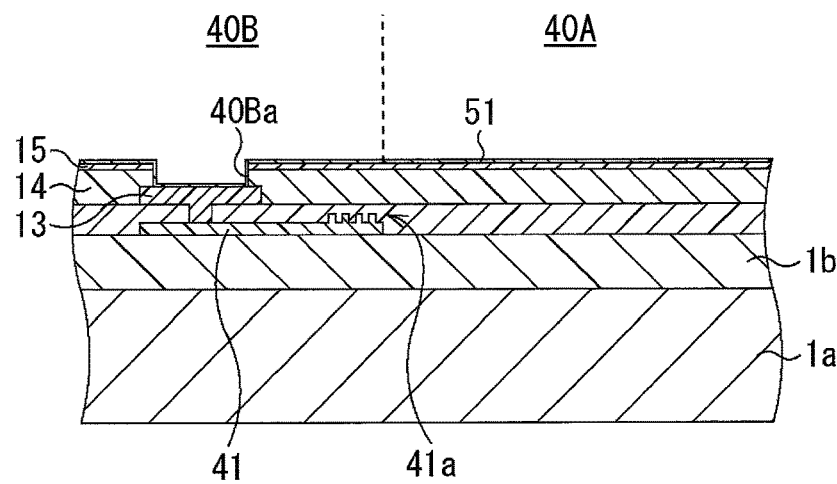

Next, as illustrated in FIG. 14B, a plating seed layer 51 is formed. Specifically, Ti (lower layer)/Cu (upper layer) are deposited, for example, by a vapor deposition method, to cover the entire surface including the opening 40Ba. Ti forms an adhesive film and Cu forms a seed film. Thus, the plating seed layer 51 is formed.

Figure 14C:
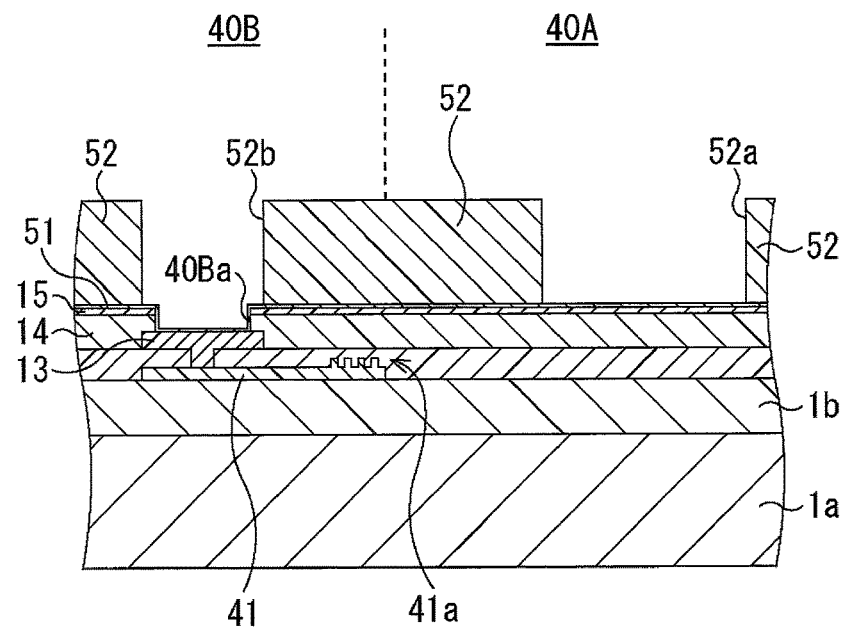

Next, as illustrated in FIG. 14C, a resist mask 52 is formed for forming an electrode. Specifically, resist is coated over the entire surface and the resist is processed by lithography. This forms the resist mask 52 having an opening 52a in the first mounting area 40A and an opening 52b in the second mounting area 40B. In the resist mask 52, the opening 52a exposes a predetermined region and the opening 52b exposes a region including the opening 40Ba.

Figure 15A:
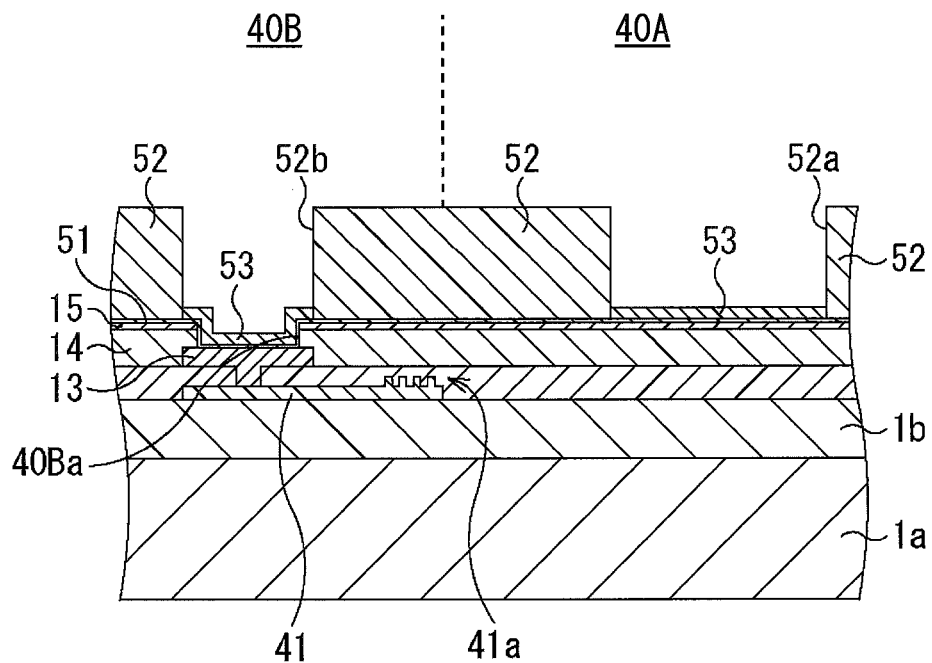
FIGS. 15A to 15B are schematic cross-sectional views illustrating major processing stages of the optical device following FIG. 14C according to the first modified example of the second embodiment.

Next, as illustrated in FIG. 15A, electrode materials 53 are deposited. Specifically, predetermined electrode materials 53 are deposited on the plating seed layer 51 exposed in the openings 52a and 52b by an electric field plating method to form a multi-layer configuration of Ni (lower layer)/Au (upper layer) each of which has a thickness of, for example, approximately 1 nm/approximately 150 nm.

Figure 15B:
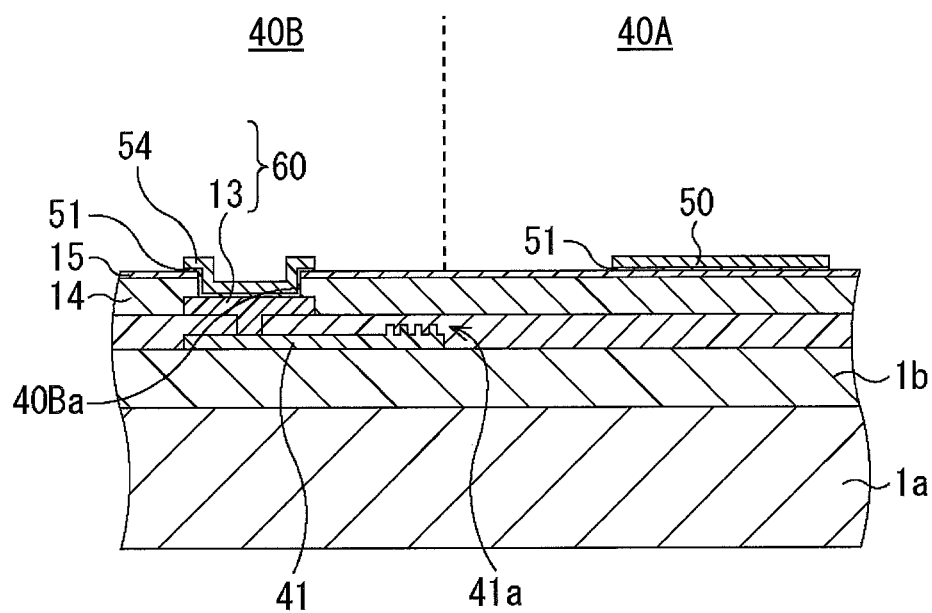

Next, as illustrated in FIG. 15B, an LD electrode 50 and a UBM layer 54 having the same structure are formed simultaneously. Specifically, the resist mask 52 and the plating seed layer 51 below are removed. Thus, the LD electrode 50 and the UBM layer 54 having the same structure (the same materials, the same layer structure, and the same thickness) are formed simultaneously. In other words, the LD electrode 50 and the UBM layer 54 are formed as structures in which multiple conductive films of the same materials having substantially the same thickness are layered. The LD electrode 50 is formed on the first mounting surface of the first mounting area 40A, and the UBM layer 54 is formed on the second mounting surface of the second mounting area 40B. In the second mounting area 40B, the Al layer 13 and the UBM layer 54 connected to the Al layer 13 via the opening 40Ba constitute an IC electrode 60. As the electrode materials 53 of the LD electrode 50 and the UBM layer 54, it is favorable to use Au having excellent connection reliability for the topmost layer; in the present example, Ni is used for the lower layer as an adhesive layer and Au is used for the topmost layer.

Conventionally, when an IC chip is mounted on a substrate, Ni (lower layer)/Au (upper layer) have been used as the materials of the UBM layer. Meanwhile, Ti (lower layer)/Pt (intermediate layer)/Au (upper layer) may be considered as the materials of an LD electrode. In the case of mounting an LD and an IC chip on the same substrate as in the present example, if different materials as described above were used for the LD electrode and the UBM layer, the manufacturing process would become complicated and the number of processing stages would be increased. Also, forming the LD electrode and the UBM layer of different materials might generate distortion in an optical device caused by stress difference due to the difference in the electrode materials, and hence, might impair the reliability.

In the present example, when mounting the LD and IC chip on the same substrate, the LD electrode 50 and the UBM layer 54 are simultaneously formed to have the same structure. This enables to simplify the manufacturing process, to reduce the number of processing stages, to generate no stress difference thanks to no difference in the electrode materials, and to obtain high reliability. In particular, in the present embodiment, a step is not formed on the SOI substrate 1, and the first mounting area 40A is coplanar with the second mounting area 40B; therefore, distortion in the optical device is further alleviated, and higher reliability is realized.

Figure 16A:
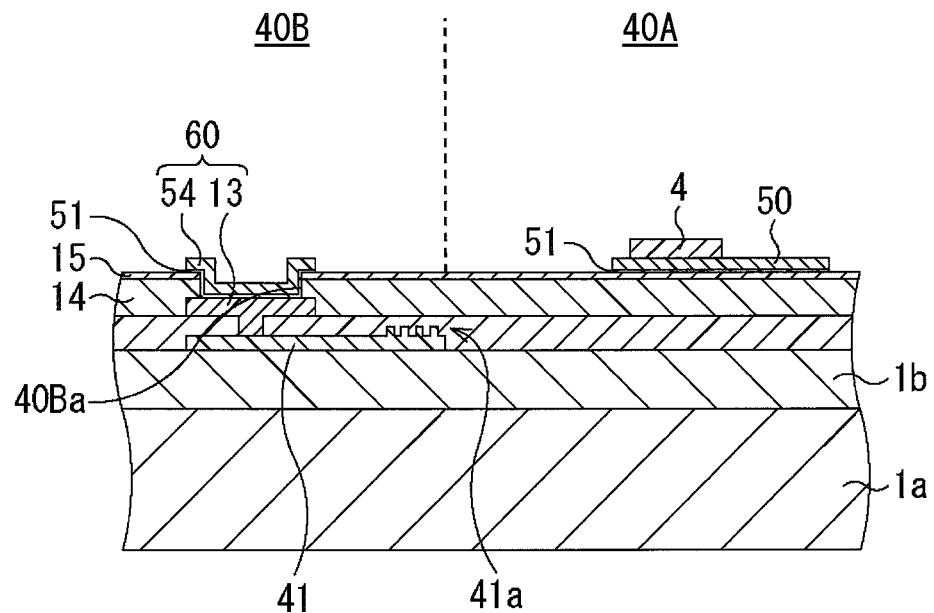
FIGS. 16A to 16B are schematic cross-sectional views illustrating major processing stages of the optical device following FIG. 15B according to the first modified example of the second embodiment.

Next, as illustrated in FIG. 16A, a first solder layer 4 is formed on the LD electrode 50. Specifically, a resist mask is formed to open a part of the surface of the LD electrode 50, and a predetermined solder material, here AuSn, is deposited on the entire surface of the resist mask including the inside of the opening. The resist mask and the solder material attached thereto are removed by lift-off. Thus, the first solder layer 4 of AuSn is formed on the LD electrode 50.

Figure 16B:
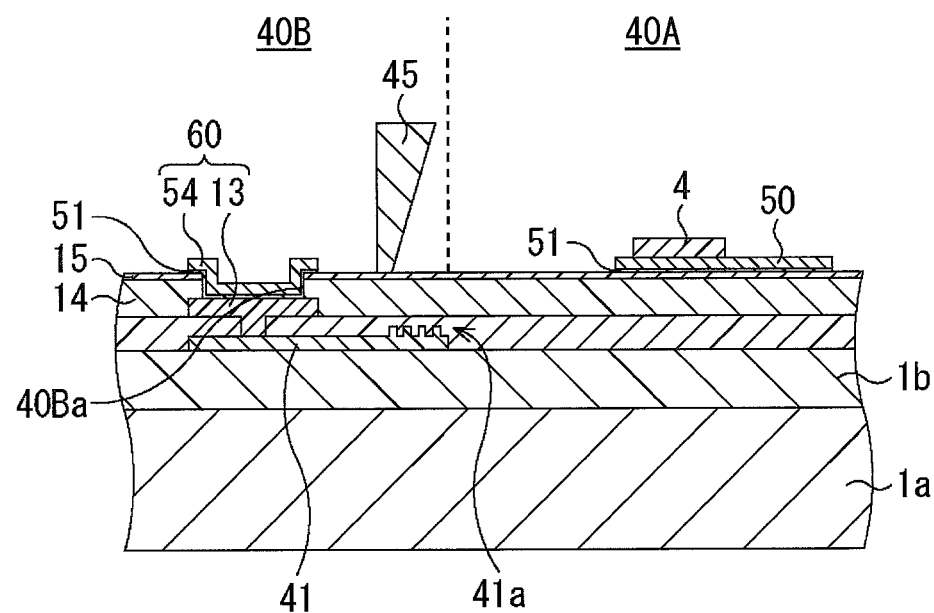

Next, as illustrated in FIG. 16B, a mirror 45 is provided. Specifically, a mirror 45 made of, for example, silicon, is provided on the protective film 15 in the second mounting area 40B near the interface with the first mounting area 40A such that the reflective surface faces an end surface on the light-emitting side of the LD 20, which is to be mounted later.

Figure 17:
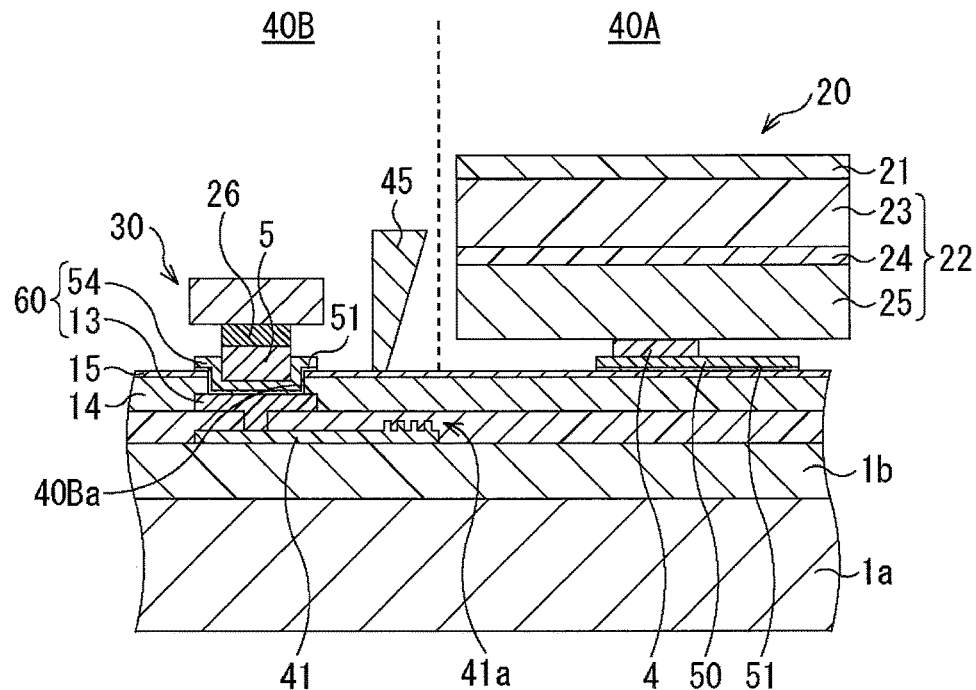
FIG. 17 is a schematic cross-sectional view illustrating a major processing stage of the optical device following FIG. 16B according to the first modified example of the second embodiment.

Next, as illustrated in FIG. 17, the LD 20 is mounted on the first mounting area 40A and the IC chip 30 is mounted on the second mounting area 40B. Specifically, the LD 20 is mounted to be connected on the first solder layer 4 of the first mounting area 40A. The LD 20 is arranged such that its end surface on the light-emitting side faces the reflective surface of a mirror 45, and one end of the active layer 24 is optically coupled with (the grating coupler 41a at) one end of the optical waveguide 41 via the mirror 45. Providing the mirror 45 enables to easily and securely obtain optical coupling between the LD 20 and the optical waveguide 41 even in the case where the first mounting area 40A is coplanar with the second mounting area 40B. The LD 20 is securely mounted on the first mounting area 40A by the first solder layer 4 that is suitable for establishing a connection with the LD electrode 50.

The IC chip 30 is mounted to be connected on the UBM layer 54 of the second mounting area 40B by having the second solder layer 5 of the IC chip 30 come face to face with the UBM layer 54. The IC chip 30 is securely mounted on the second mounting area 40B by the second solder layer 5 that is suitable for establishing a connection with the UBM layer 54. Thus, the optical device according to the present example is formed.

As described above, according to the present example, an optical device is realized that has an LD 20 and an IC chip 30 mounted on the same substrate, has high reliability, and enables to simplify the manufacturing process and to achieve a reduction in the number of processing stages.

Second Modified Example

Figure 18:
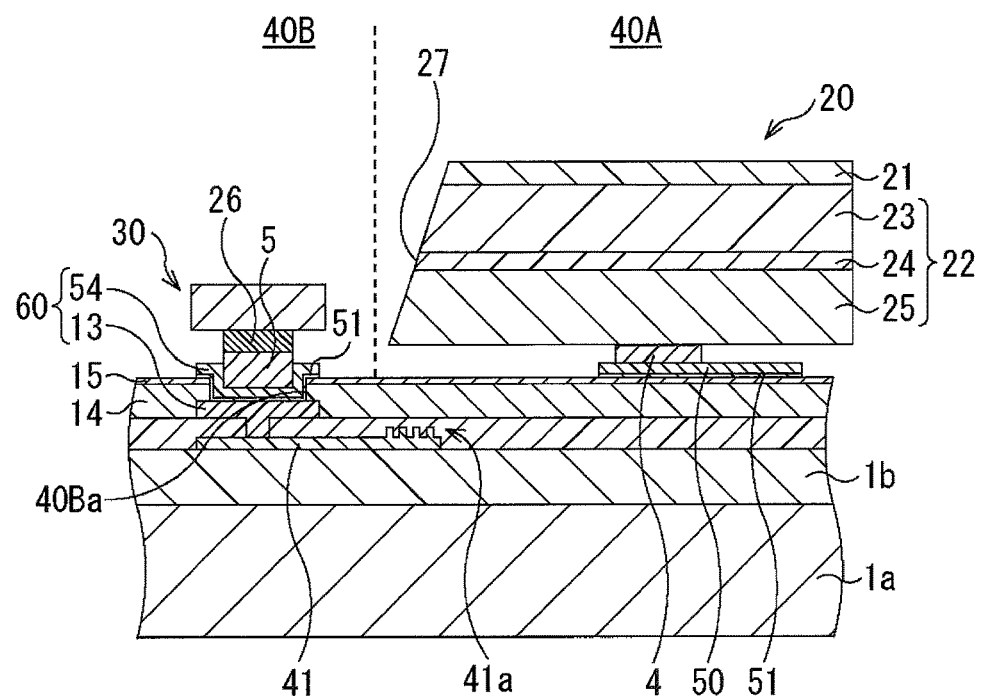
FIG. 18 is a schematic cross-sectional view of an optical device according to a second modified example of the second embodiment.

In the second embodiment and the first modified example, although cases have been disclosed in which the mirror 45 facing the end surface on the light-emitting side of the LD 20 is provided, a case may be considered in which a mirror 45 is not provided. FIG. 18 is a schematic cross-sectional view of an optical device according to a second modified example of the second embodiment.

In the optical device according to the present example, the end surface on the light-emitting side of the LD 20 is formed to be inclined with respect to the vertical direction, and a reflective film 27 is formed on the end surface on the light-emitting side. This causes light emitted from the LD 20 to be reflected by the reflective film 27 and to be incident on (the grating coupler 41a at) one end of the optical waveguide 41 In this way, the LD 20 has one end of the active layer 24 optically coupled with one end of the optical waveguide 41.

In the present example, when mounting the LD and IC chip on the same substrate, the LD electrode 50 and the UBM layer 54 are simultaneously formed to have the same structure. This enables to simplify the manufacturing process, to reduce the number of processing stages, to generate no stress difference thanks to no difference in the electrode materials, and to obtain high reliability. In particular, a step is not formed on the SOI substrate 1, and the first mounting area 40A is coplanar with the second mounting area 40B;

therefore, distortion in the optical device is further alleviated, and higher reliability is realized. Further, since a mirror 45 is not required, the number of required components can be reduced to realize a simplified configuration.

As described above, according to the present example, an optical device is realized that has an LD 20 and an IC chip 30 mounted on the same substrate, has high reliability, and enables to simplify the manufacturing process and to achieve a reduction in the number of processing stages.

Note that in the first and second embodiments and the modified examples, although an LD is exemplified as a light-emitting element mounted on an optical device, the element is not limited as such; for example, a light-emitting diode may be used. Also, it is applicable to a case where a semiconductor optical amplifier (SOA) or the like is mounted on an optical device. An optical device according to the present embodiment can be used, for example, for optical interconnection between boards, between chips, or within a chip using optical wiring on a substrate, or for optical fiber communication using optical fibers.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical device comprising:
   a light-emitting element;
   an optical waveguide optically coupled with the light-emitting element;
   an electronic circuit chip formed over the optical waveguide;
   a substrate having first and second mounting surfaces on which the light-emitting element and the electronic circuit chip are respectively mounted, the first mounting surface formed to be positioned lower than the second mounting surface with reference to a bottom surface of the substrate;
   a first electrode formed on the first mounting surface of the light-emitting element on the substrate; and
   a second electrode formed on the second mounting surface of the electronic circuit chip on the substrate, such that the first electrode is formed at a position lower than a position at which the second electrode is formed,
   wherein the first electrode and the second electrode have a same structure, and
   wherein the second mounting surface is a film, from among films, constituting the substrate, and the optical waveguide is provided below the film forming the second mounting surface to be at a height between a position at which the first electrode is formed on the first mounting surface and a position at which the second electrode is formed on the second mounting surface.

2. The optical device as claimed in claim 1, wherein the first electrode and the second electrode are made of a same material.

3. The optical device as claimed in claim 1, wherein the first electrode and the second electrode have a same thickness.

4. The optical device as claimed in claim 1, wherein both the first electrode and the second electrode are formed by layering a plurality of conductive films.

5. The optical device as claimed in claim 1, wherein the first electrode and the second electrode have a gold film at least as a topmost layer.

6. The optical device as claimed in claim 1, wherein a first solder layer is provided between the light-emitting element and the first electrode, and a second solder layer is provided between the electronic circuit chip and the second electrode.

7. The optical device as claimed in claim 1, wherein one end of the light-emitting element is positionally aligned with one end of the optical waveguide.

8. A method of manufacturing an optical device, the method comprising:
   forming a first electrode on a first mounting surface of a substrate simultaneously with a second electrode on a second mounting surface of the substrate, wherein the first electrode and the second electrode have a same structure, and the first mounting surface is positioned lower than the second mounting surface with reference to a bottom surface of the substrate, such that the first electrode is formed at a position lower than a position at which the second electrode is formed;
   mounting a light-emitting element over the first mounting surface via the first electrode;
   forming an optical waveguide, optically coupled with the light-emitting element, on the second mounting surface; and
   mounting an electronic circuit chip over the optical waveguide on the second mounting surface via the second electrode,
   wherein the second mounting surface is a film, from among films, constituting the substrate, and the optical waveguide is provided below the film forming the second mounting surface to be at a height between a position at which the first electrode is formed on the first mounting surface and a position at which the second electrode is formed on the second mounting surface.

9. The method of manufacturing the optical device as claimed in claim 8, wherein the first electrode and the second electrode are formed of a same material.

10. The method of manufacturing the optical device as claimed in claim 8, wherein the first electrode and the second electrode are formed to have a same thickness.

11. The method of manufacturing the optical device as claimed in claim 8, wherein both the first electrode and the second electrode are formed by layering a plurality of conductive films.

12. The method of manufacturing the optical device as claimed in claim 8, wherein the first electrode and the second electrode have a gold film at least as a topmost layer.

13. The method of manufacturing the optical device as claimed in claim 8, wherein a first solder layer is provided between the light-emitting element and the first electrode, and a second solder layer is provided between the electronic circuit chip and the second electrode.

14. The method of manufacturing the optical device as claimed in claim 8, the method further comprising:
   forming a step on the substrate such that the first mounting surface is positioned lower than the second mounting surface with reference to the bottom surface of the substrate.

* * * * *